United States Patent
Clevenger et al.

(10) Patent No.: US 6,869,895 B1
(45) Date of Patent: Mar. 22, 2005

(54) METHOD FOR ADJUSTING CAPACITANCE OF AN ON-CHIP CAPACITOR

(75) Inventors: Lawrence A. Clevenger, LaGrangeville, NY (US); Timothy J. Dalton, Ridgefield, CT (US); Louis L. Hsu, Fishkill, NY (US); Carl Radens, LaGrangeville, NY (US); Keith Kwong Hon Wong, Wappingers Falls, NY (US); Chih-Chao Yang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/674,719

(22) Filed: Sep. 30, 2003

(51) Int. Cl.[7] .................................... H01L 21/31

(52) U.S. Cl. ................... 438/787; 438/787; 438/171

(58) Field of Search .................... 438/787, 171, 438/184, 190, 238, 239, 243, 250

(56) References Cited

U.S. PATENT DOCUMENTS

| | | | |
|---|---|---|---|
| 4,709,225 A | | 11/1987 | Welland et al. ............ 340/347 |
| 5,122,483 A | * | 6/1992 | Sakai et al. ................ 438/787 |
| 6,426,903 B1 | | 7/2002 | Clevenger et al. .......... 365/200 |

OTHER PUBLICATIONS

Dutt, et al., "Integrated Circuit SNR improvement using Dielectric Altering Compound, Laser Trim and FIB system," Proc. 26th International Symposium for Testing and Failure Analysis (ISTFA2000), (ASM International, Materials Park, Ohio) pp. 323–326 (2000).
Kotecki, et al., "(Ba,Sr)TiO3 dielectrics for future stacked–capacitor DRAM," J. Res. Develop, 43 (3), May 1999.
LASERtrim® Tuning Application Notes, "Active Trimming Characteristics of Lasertrim® Chip Capacitors," Johanson Technology, Inc. © 1998 Datasheet LZT983.
Liu, et al., "Effective Strategy for Porous Organosilicate to Suppress Oxygen Ashing Damage," Electrochemical and Solid State Letters, 5(3), G11–G14, 2002.
Machalett, et al., "Focused–ion–beam writing of electrical connections into platinum oxide films," Applied Physics Letters, 76 (23), Jun. 5, 2000.
Wang, et al., "Structural and Electrical Characteristics of Low–Dielectric Constant Porous Hydrogen Silsesquioxane for Cu Metallization," J. The Electrochemical Soc., 150 (8), F141–F146, 2003.

* cited by examiner

Primary Examiner—David Nelms
Assistant Examiner—Thinh T Nguyen
(74) Attorney, Agent, or Firm—Moser, Patterson & Sheridan, LLP; Kin-Wah Tong, Esq.; Wan Yae Cheung, Esq.

(57) ABSTRACT

A method and apparatus for adjusting capacitance of an on-chip capacitor uses exposure of a dielectric material of the capacitor to an ion beam comprising ions of at least one material to modify a dielectric constant of the dielectric material.

9 Claims, 3 Drawing Sheets

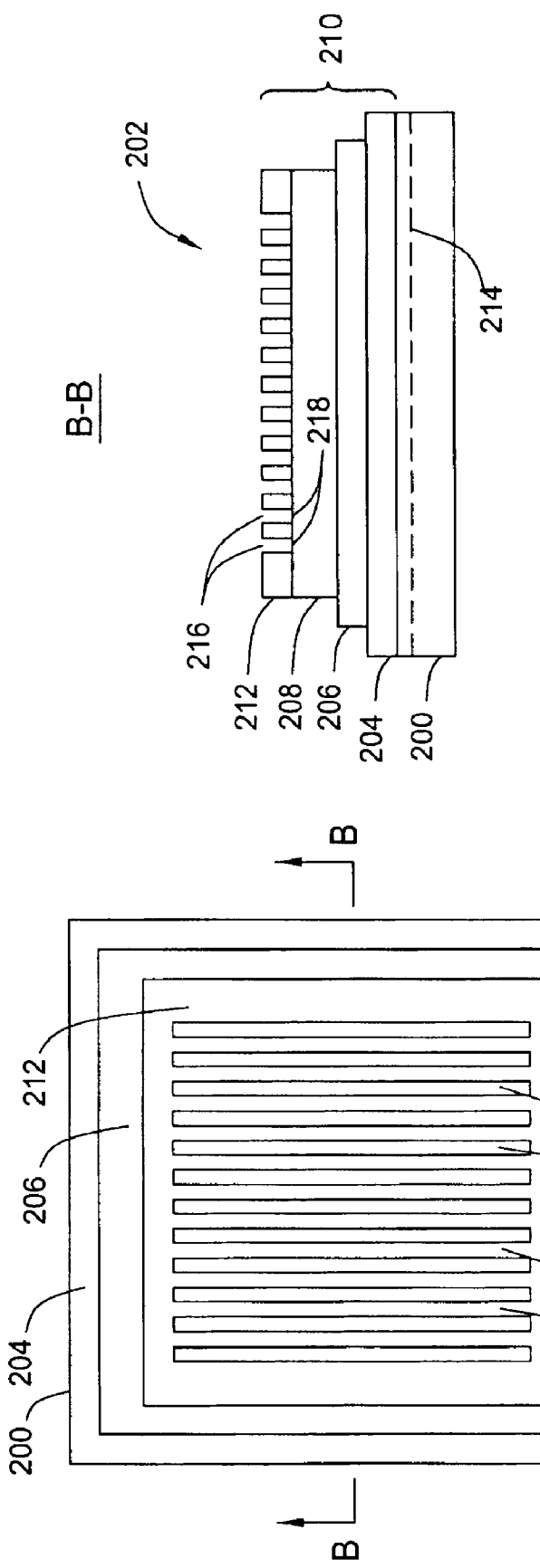

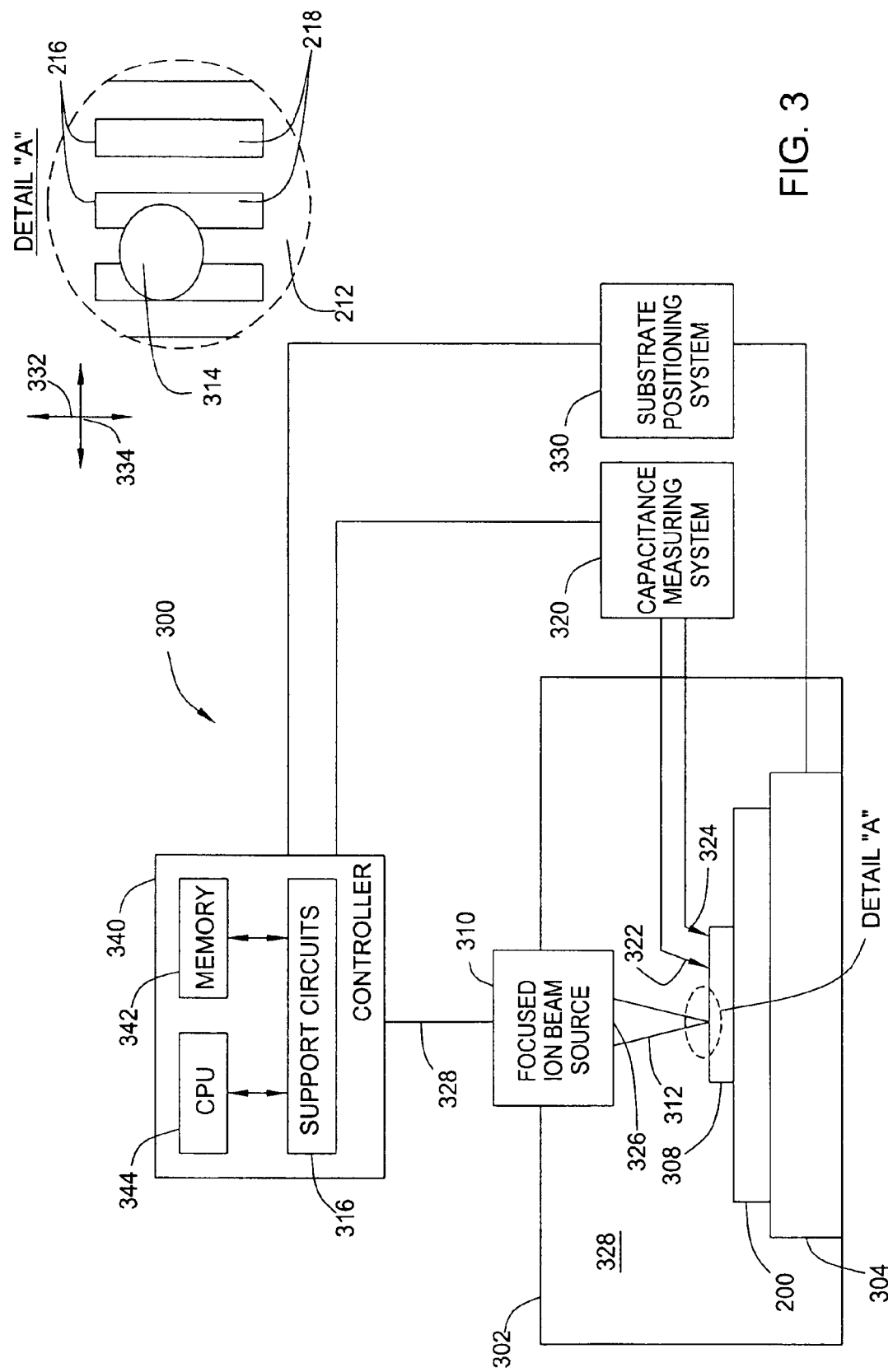

METHOD FOR ADJUSTING CAPACITANCE OF AN ON-CHIP CAPACITOR

BACKGROUND OF THE INVENTION

1. Field of the Invention

The present invention generally relates to a method for fabricating devices on semiconductor substrates. More specifically, the present invention relates to a method for adjusting capacitance of on-chip capacitors formed on a semiconductor substrate.

2. Description of the Related Art

Advanced integrated circuits (ICs) may include more than one million micro-electronic devices that are formed on a semiconductor substrate and cooperate to perform various functions within the IC. Conventionally, ICs may use add-on precision surface-mount discrete capacitors and on-chip (i.e., thin film) capacitors. On-chip capacitors have significant integration, reliability, and cost advantages over the surface-mount discrete capacitors, particularly, in applications such as portable and mobile devices, cell phones, personal digital assistants (PDAs), and the like. However, variables of manufacturing processes may result in inaccuracy of the capacitance of on-chip capacitors.

Methods used to adjust capacitance of the on-chip capacitors include laser trimming of a capacitor to a predetermined, or target, capacitance, as well as use of on-chip trim capacitors that may be selectively disconnected from the capacitor being adjusted. Such methods require allocation on the substrate of an additional surface area for the large on-chip capacitor being then trimmed down or the trim capacitors. Furthermore, fragments of the materials dispersed across the substrate by the laser beam during processes of laser trimming the capacitor or laser cutting the conductors connecting the trim capacitors may contaminate or damage the IC.

Therefore, there is a need in the art for an improved method for adjusting capacitance of on-chip capacitors in manufacture of integrated circuits.

SUMMARY OF THE INVENTION

A method for adjusting capacitance of an on-chip capacitor using exposure of a dielectric material of the capacitor to an ion beam comprising ions of at least one material that can modify a dielectric constant of the dielectric material.

Another aspect of the invention is an on-chip capacitor comprising at least one insulative layer that separates the conductive layers, wherein the at least one insulative layer comprises a material that was exposed to an ion beam modifying a dielectric constant of the material.

Still another aspect of the invention is a method for adjusting capacitance of an on-chip capacitor in a substrate processing chamber by irradiating a dielectric material of the capacitor using an ion beam comprising ions of at least one material that can modify a dielectric constant of the dielectric material, and monitoring the capacitance of the on-chip capacitor being irradiated.

Yet another aspect of the invention is an apparatus for adjusting capacitance of an on-chip capacitor. The apparatus comprises a processing chamber, a source of an ion beam for irradiating a dielectric material of the capacitor, a system for measuring capacitance of the capacitor, and a controller configured to administer operation of the apparatus.

BRIEF DESCRIPTION OF THE DRAWINGS

The teachings of the present invention can be readily understood by considering the following detailed description in conjunction with the accompanying drawings, in which:

FIG. 2A depicts a top plan view of a substrate having the on-chip capacitor being adjusted in accordance with the method of FIG. 1;

FIG. 2B depict a cross-sectional view of a substrate having the on-chip capacitor being adjusted in accordance with the method of FIG. 1; and FIG. 3 depicts a schematic diagram of an exemplary processing apparatus of the kind used in performing portions of the method of FIG. 1.

Figure 1:
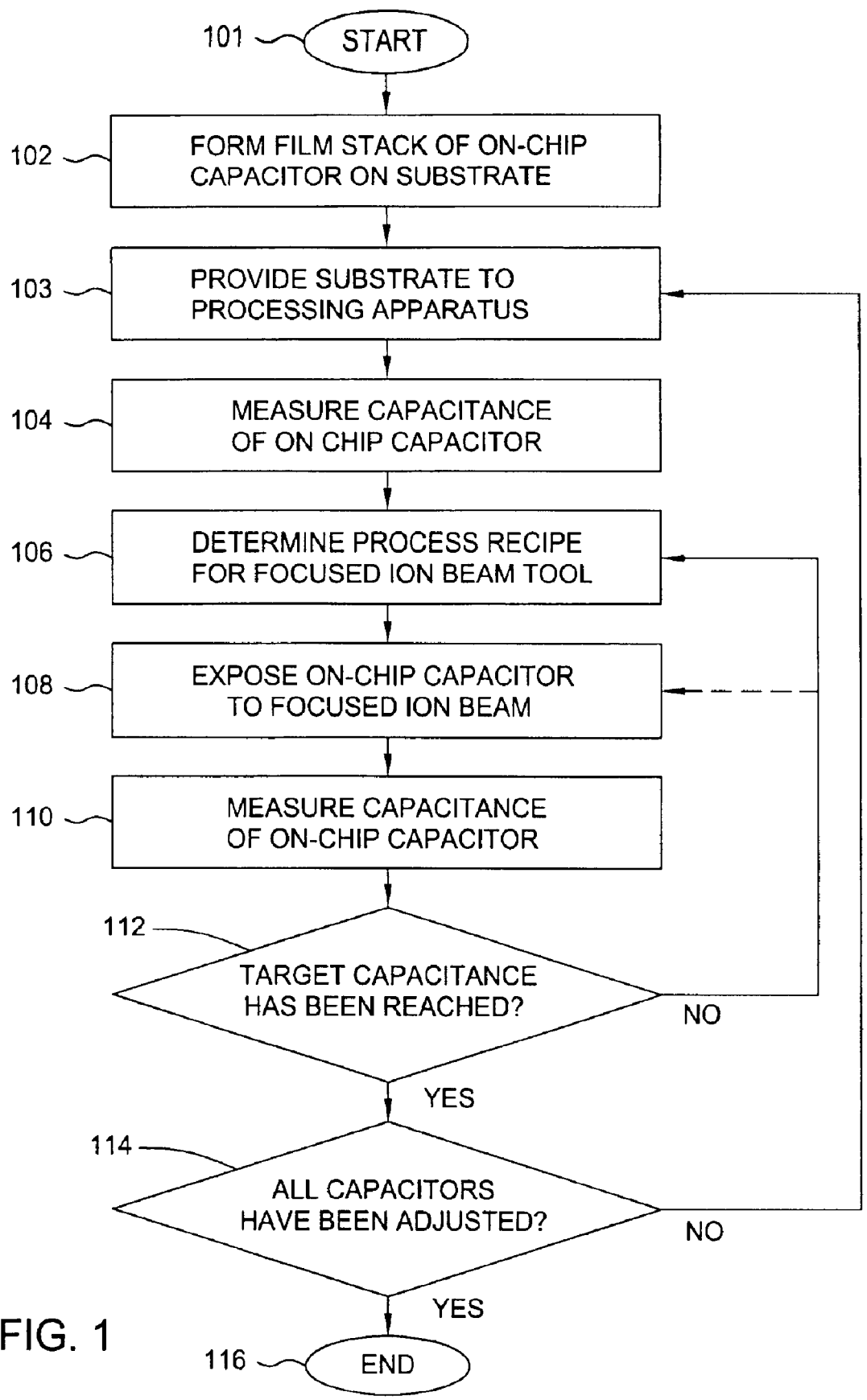
FIG. 1 depicts a flow diagram for a method for adjusting capacitance of an on-chip capacitor in accordance with one embodiment of the present invention.

To facilitate understanding, identical reference numerals have been used, where possible, to designate identical elements that are common to the figures. It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method and apparatus for adjusting capacitance of an on-chip capacitor formed on a substrate (e.g., semiconductor wafer). The method may be used for fabricating precision and high reliability on-chip capacitors.

FIG. 1 depicts a flow diagram for one embodiment of the inventive method 100 for adjusting capacitance of an on-chip capacitor. The method 100 includes the processes that are performed upon a film stack to adjust capacitance of the capacitor.

FIGS. 2A and 2B depict, respectively, schematic top plan and cross-sectional views of a substrate showing the on-chip capacitor being adjusted using the method 100. The cross-sectional view in FIG. 2B is taken along a centerline B—B in FIG. 2A. FIG. 3 depicts a schematic diagram of an exemplary processing apparatus of the kind used in performing one or more steps of method 100 of FIG. 1.

The images in FIGS. 2A–2B and FIG. 3 are not depicted to scale and are simplified for illustrative purposes. To best understand the invention, the reader should simultaneously refer to FIGS. 1, 2A–2B, and 3.

The method 100 starts at step 101 and proceeds to step 102. At step 102, a film stack 210 of an on-chip capacitor 202 is formed on a substrate 200 (e.g., silicon (Si) wafer, gallium arsenide (GaAs) wafer, and the like) (See FIGS. 2A–2B). In one embodiment, the on-chip capacitor 202 is a precision thin film capacitor having the film stack 210 that illustratively comprises a barrier layer 204, a bottom electrode 206, a dielectric layer 208, and a top electrode 212.

The barrier layer 204 electrically isolates the bottom electrode 206 from the substrate 200 and may be formed from a dielectric material, such as silicon dioxide ($SiO_2$), silicon carbide (SiC), silicon nitride ($Si_3N_4$), and the like. The substrate 200 may comprise one or more conductive and dielectric layers disposed beneath the film stack 210. When the substrate 200 comprises a dielectric upper film 214 (shown in phantom in FIG. 2B), the barrier layer 204 may not be needed. As such, the barrier layer 204 is considered optional.

The bottom electrode 206 and the top electrode 212 are generally formed from at least one conductive material (e.g., titanium (Ti), tantalum (Ta), tungsten (W), platinum (Pt), titanium nitride (TiN), and the like) or a conductive alloy thereof. The dielectric layer 208 is generally formed to a thickness of about 50 to 1000 Angstroms and may comprise at least one film of silicon dioxide, barium-strontium titanate $(Ba,Sr)TiO_3$, porous organosilicate, titanium oxide, tantalum oxide, zierconium oxide, yttrium oxide, aluminum oxide, and silicon nitride and the like.

In one exemplary embodiment, the top electrode 212 is patterned to expose portions 218 of the underlying dielectric layer 208. In the depicted embodiment, the top electrode 212 comprises a plurality of grooves (openings) 216 that expose the portions 218. In an alternate embodiment, the top electrode 212 may be patterned to comprise openings 216 having a different configuration, for example, circular openings, square openings, grid-like openings, and the like. Together, the openings 216 may expose about 15 to 85% of the surface area of the dielectric layer 208. In a further embodiment (not shown), the top electrode 212 and, optionally, the bottom electrode 206, may be partially embedded in the dielectric layer 208. In such an embodiment, the entire surface area of the dielectric layer 208 may be exposed.

The layers comprising the film stack 210 may be deposited using thin film deposition techniques (e.g., atomic layer deposition (ALD), physical vapor deposition (PVD), chemical vapor deposition (CVD), plasma enhanced CVD (PECVD), and the like), spin on and then patterned using conventional lithographic and plasma etch processes. Manufacturing variables of such processes may result in inaccuracy of capacitance of the on-chip capacitor 202. As such, when the on-chip capacitor 202 is formed, the capacitance of should be adjusted to a pre-determined, or target, capacitance.

At step 103, the substrate 200 is provided to a processing apparatus 300 (E.G., FIG. 3). In one embodiment, the processing apparatus 300 comprises a vacuum chamber 302, a capacitance measuring system 320, a substrate positioning system 330, and a controller 340. The vacuum chamber 302 generally comprises a substrate pedestal 304 and a source 310 of a focused ion beam 312. In the depicted embodiment, the source 310 is illustratively show as partially located within reaction volume 328 of the vacuum chamber 302. Typically, a portion of source 310 that comprises an irradiating orifice 326 is positioned in the reaction volume 328, while other portions of the source 310 (e.g., power supplies, control system, and the like) may be located external to the reaction volume.

The controller 340 facilitates control of the processing apparatus 300 and may be one of any form of general-purpose computer processor used in an industrial setting to control various processing chambers and sub-processors. The controller 340 generally comprises a central processing unit (CPU) 344, a memory 342, and support circuits 316. The memory 342 may be in one or more forms of digital storage (e.g., electronic memory, a magnetic or optical disk, and the like), local or remote. The support circuits 316 may include cache, power supplies, clock circuits, input/output circuitry, and the like. In one embodiment, the inventive method is stored in the memory 342 as a software routine. Alternatively, the software routine may also be stored and/or executed by other CPU (not shown) that is remotely located from the hardware being controlled by the controller 340.

In the vacuum chamber 302, the substrate 200 is placed on the substrate pedestal 304. In one embodiment, the substrate positioning system 330 is coupled, in a conventional way, to the substrate pedestal 304 to define the location (i.e., topographic coordinates) of the on-chip capacitor 202 on the substrate 200. The substrate positioning system 330 may use, for example, lithographic marks, as well as other reference marks on the substrate 200 to locate the on-chip capacitor 202. In operation, topographic coordinates of the on-chip capacitor 202 are used in the processing apparatus 300 for positioning of the on-chip capacitor, for positioning of electrical probes 322 and 324 for the capacitance measuring system 320, and for controlling of a focal point of the focused ion beam 312. In one exemplary embodiment, the substrate positioning system 330 positions the on-chip capacitor 202 at a pre-determined location with respect to the focal point of the focused ion beam 312. Alternatively, the on-chip capacitor 202 may be positioned at the pre-determined location with respect to the electrical probes 322, 324.

At step 104, capacitance of the on-chip capacitor 202 is measured using the capacitance measuring system 320. In the depicted embodiment, the measurements are performed in-situ (i.e., in the vacuum chamber 302) using electrical probes 322 and 324 that are engaged to contact the bottom electrode 206 and top electrode 212, respectively. The results of the measurements are communicated to the controller 340 for analysis.

In an alternative embodiment, the capacitance of the on-chip capacitor 202 may be measured ex-situ before the substrate 200 is placed in the vacuum chamber 302. After the measurements, the substrate is provided to the chamber and positioned on the substrate pedestal 304, as described above in reference to step 103.

At step 106, the controller 340 analyses a difference between the measured capacitance of the on-chip capacitor 202 and the target capacitance of that capacitor and defines parameters of a process recipe for the source 310 of the focused ion beam 312. In other words, the controller may select different parameters in formulating the process of irradiating the on-chip capacitor. When executed in the processing apparatus 300, such a process recipe facilitates adjusting a starting capacitance (i.e., the capacitance measured at step 104 above) of the on-chip capacitor 202 to the target capacitance. In one embodiment, to define the parameters of the process recipe, the controller 340 may use data that is collected on the test substrates comprising the on-chip capacitors 202. Such collection may include measurements of dependence of the capacitance from chemical composition, concentration, and intensity of the focused ion beam 312, dimensions of a spot 314 irradiated by the focused ion beam 312 on the on-chip capacitor, material of the dielectric layer 208, process time duration, and the like.

It should be noted that the present invention also provides the ability to reverse the effect of the induced change. Namely, for example, fluorine atoms can be added or removed from the thin film by changing the chemistry and environment of the ion beam process. This reversible aspect is an advantage over physical trimming. For example, it has been shown that one can increase the dielectric constant of a porous organic silicate by exposing it to an oxygen plasma, and the effect can be reversible by treating it with furnace degassing, or TMCS (tetramethylchlorosilane) with or without additional hydrogen plasma treatment.

In an alternate embodiment, the processing apparatus 300 may operate the source 310 using a pre-selected process recipe (discussed below in reference to step 110). In such an embodiment, step 106 is considered optional. During the irradiating process of step 108 below, the changes in the capacitance of the on-chip capacitor 202 are monitored in real time until the target capacitance is achieved.

At step 108, the source 310 irradiates the on-chip capacitor 202 using the focused ion beam 312 (FIG. 3). The beam 312 comprised ions of at least one material that can modify (i.e., change) a dielectric constant of a material of the dielectric layer 208 by altering the chemical composition of the material. In the depicted embodiment, the focused ion beam 312 penetrates though the openings 216 in the top electrode 212 and dopes the portions 218 of the dielectric layer 208, thereby modifying the dielectric constant of the material of the dielectric layer and changing the capacitance of the on-chip capacitor 202.

In one embodiment, the focused ion beam 312 may only irradiate a small surface area of the top electrode 212 (FIG. 3, detail "A"). However, the present invention is not so limited.

In another embodiment, the focused ion beam 312 may scan across the surface area of the top electrode (illustrated using arrows 332, 334) to irradiate the portions 218 of the dielectric layer 208 outside the spot 314. Scanning of the beam may be facilitated using beam controls of the source 310. Alternatively, the position of the spot 314 may be fixed, while the substrate positioning system 330 engages the substrate 200 in a reciprocating motion to facilitate irradiation of the exposed portions 218. In a further embodiment, both the source 310 and system 330 may participate in moving the spot 314 across the top electrode 212 to irradiate the portions 218.

The source 310 produces the focused ion beam 312 in accordance with the process recipe defined at step 106 above. In one exemplary embodiment, the focused ion beam 312 comprises ions of fluorine (F) and is used to decrease the dielectric constant of the silicon dioxide ($SiO_2$) dielectric layer 208. In another exemplary embodiment, the focused ion beam 312 comprising ions of oxygen (O) is used to increase the dielectric constant of the barium-strontium titanate $(Ba,Sr)TiO_3$ dielectric layer 208. In one embodiment, nitrogen can be used as well.

At step 110, the capacitance measuring system 320 measures capacitance of the on-chip capacitor 202 having the dielectric layer 208 irradiated using the focused ion beam 312. The results of these measurements are communicated to the controller 340 for analysis. In one embodiment, the capacitance measuring system 320 performs real-time measurements of the capacitance when the on-chip capacitor 202 is being irradiated by the focused ion beam 312. Alternatively, the capacitance of the on-chip capacitor 202 may be periodically measured during time intervals when the source 310 is temporarily disabled.

At step 112, the method 100 queries if the capacitance the on-chip capacitor 202 has been adjusted to the target capacitance. If the query of step 112 is negatively answered, in one embodiment, the method 100 proceeds to step 106 to modify the parameters of the process recipe for the source 310 (e.g., increase or decrease in the focused ion beam 312 concentration of ions that can change the dielectric constant of the material of the dielectric layer 208, use ions of a different material, and the like). In another embodiment (show in phantom in FIG. 1), the method 100 proceeds to step 108 to continue irradiating the dielectric layer 208 using the process recipe defined at step 104 above until the target capacitance is achieved.

If the query of step 112 is affirmatively answered, the method 100 proceeds to step 114. At step 114, the method 100 queries if, on the substrate 200, capacitance of all on-chip capacitors 202 has been adjusted as discussed above in reference to steps 103–112. If the query of step 114 is negatively answered, the sequence 100 proceeds to step 103 to locate next on-chip capacitor. If the query of step 114 is affirmatively answered, the method 100 proceeds to step 116. At step 116, the method 100 ends.

While the foregoing is directed to the illustrative embodiment of the present invention, other and further embodiments of the invention may be devised without departing from the basic scope thereof, and the scope thereof is determined by the claims that follow.

What is claimed is:

1. A method for adjusting capacitance of an on-chip capacitor, comprising the steps of:

providing the on-chip capacitor, wherein the on-chip capacitor has at least one material layer having a dielectric constant that defines a capacitance of the on-chip capacitor; and exposing said at least one material layer to an ion beam comprising ions of at least one material, thereby modifying the dielectric constant of said at least one material layer to effect a change in said capacitance of the on-chip capacitor.

2. The method of claim 1, wherein said at least one material layer is comprised of at least one of silicon dioxide ($SiO_2$), barium-strontium titanate $(Ba,Sr)TiO_3$, porous organosilicate, titanium oxide, tantalum oxide, zierconium oxide, yittrium oxide, aluminum oxide, and silicon nitride.

3. The method of claim 1, wherein said at least one material comprises at least one of fluorine ($F_2$), oxygen ($O_2$), and nitrogen.

4. The method of claim 1, wherein said ion beam is a focused ion beam having a controlled concentration of ions.

5. A method for adjusting capacitance of an on-chip capacitor formed on a substrate, comprising the steps of:

providing the substrate to a substrate processing chamber having a substrate support pedestal and a substrate positioning system;

irradiating a dielectric material of the on-chip capacitor using an ion beam comprised of ions, thereby modifying a dielectric constant of said dielectric material to effect a change in a capacitance of the on-chip capacitor; and monitoring said capacitance of the on-chip capacitor.

6. The method of claim 5, wherein said dielectric material comprises at least one of silicon dioxide ($SiO_2$), barium-strontium titanate $(Ba,Sr)TiO_3$, porous organosilicate, titanium oxide, tantalum oxide, zierconium oxide, yittrium oxide, aluminum oxide, and silicon nitride.

7. The method of claim 5, wherein said ion beam comprises at least one of fluorine ($F_2$), oxygen ($O_2$), and nitrogen.

8. The method of claim 5, wherein said ion beam is a focused ion beam having a controlled concentration of ions.

9. The method of claim 5 wherein said irradiating step is implemented in accordance with at least one processing parameter, wherein said at least one processing parameter defines a concentration of said ions, an intensity of said ion beam, or a time duration of applying said ion beam.

* * * * *